(12) United States Patent
Wang et al.

(10) Patent No.: US 10,942,063 B2
(45) Date of Patent: Mar. 9, 2021

(54) APPARATUS AND METHOD FOR MEASURING AMPLITUDE OF SCANNING REFLECTOR

(71) Applicant: SHANGHAI MICRO ELECTRONICS EQUIPMENT (GROUP) CO., LTD., Shanghai (CN)

(72) Inventors: Xinghai Wang, Shanghai (CN); Mingbo Yuan, Shanghai (CN); Haijiang Wang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 229 days.

(21) Appl. No.: 16/321,592

(22) PCT Filed: Jul. 27, 2017

(86) PCT No.: PCT/CN2017/094614
§ 371 (c)(1),
(2) Date: Jan. 29, 2019

(87) PCT Pub. No.: WO2018/019265
PCT Pub. Date: Feb. 1, 2018

(65) Prior Publication Data
US 2019/0310133 A1    Oct. 10, 2019

(30) Foreign Application Priority Data
Jul. 29, 2016    (CN) .......................... 201610614644.9

(51) Int. Cl.
*H01J 3/14*     (2006.01)
*G01J 1/42*     (2006.01)
(Continued)

(52) U.S. Cl.
CPC ........... *G01J 1/4257* (2013.01); *G01J 1/4228* (2013.01); *G02B 26/0816* (2013.01);
(Continued)

(58) Field of Classification Search
CPC .. G03F 7/20; G03F 9/00; G01J 1/4257; G01J 1/4228; G02B 26/10; G02B 26/0816
(Continued)

(56) References Cited

U.S. PATENT DOCUMENTS

| 4,558,949 A | 12/1985 | Uehara et al. |
| 2002/0027193 A1 | 3/2002 | Olschewski |

FOREIGN PATENT DOCUMENTS

| CN | 1493895 A | 5/2004 |
| CN | 101201546 A | 6/2008 |

(Continued)

*Primary Examiner* — Georgia Y Epps
(74) *Attorney, Agent, or Firm* — Muncy, Geissler, Olds & Lowe, PC

(57) ABSTRACT

A device and method for measuring amplitude of a scanning mirror are disclosed. The device includes a light source (20) for outputting an optical signal; a diaphragm (21) for modifying size and shape of a light spot of the optical signal output by the light source (20); a scanning mirror retainer for placing a scanning mirror (22) to be measured, the scanning mirror, after being retained, being able to periodically reflect the optical signal; a photoelectric sensor (23) including three or more sensing elements and configured to detect and collect the optical signal reflected by the scanning mirror (22); and a signal acquisition and processing unit (24) for processing a signal collected by the photoelectric sensor (23) to derive an amplitude of the scanning mirror (22). Therefore, it is possible to characterize the scanning mirror (22) before the scanning mirror (22) is used, determining performance of the scanning mirror (22).

10 Claims, 3 Drawing Sheets

(51) Int. Cl.
 *G02B 26/08* (2006.01)
 *G02B 26/10* (2006.01)
 *G03F 9/00* (2006.01)
 *G03F 7/20* (2006.01)

(52) U.S. Cl.
 CPC ............ *G02B 26/10* (2013.01); *G03F 7/20* (2013.01); *G03F 9/00* (2013.01)

(58) Field of Classification Search
 USPC ....................................................... 250/236
 See application file for complete search history.

(56) References Cited

FOREIGN PATENT DOCUMENTS

| | | |
|---|---|---|
| CN | 101344727 A | 1/2009 |
| CN | 100535763 C | 9/2009 |
| CN | 102033438 A | 4/2011 |
| CN | 104423181 A | 3/2015 |
| CN | 105700297 A | 6/2016 |
| JP | 2003140078 A | 5/2003 |
| JP | 2005321484 A | 11/2005 |
| JP | 2010072182 A | 4/2010 |
| SU | 1805337 A1 | 1/2009 |
| TW | 201621482 A | 6/2016 |
| WO | WO 2008032485 A1 | 3/2008 |

APPARATUS AND METHOD FOR MEASURING AMPLITUDE OF SCANNING REFLECTOR

TECHNICAL FIELD

The present invention relates to the field of semiconductor equipment and, in particular, to a device and method for measuring amplitude of a scanning mirror.

BACKGROUND

A projection photolithography tool is a piece of equipment that projects an image of a mask pattern onto a wafer by means of an objective lens. The projection photolithography tool must be provided with a control system for automatic focusing, which is capable of accurately placing a wafer surface to a specified position for exposure. Such a system can be accomplished in several ways. For example, a scanning mirror and a detection slit may be arranged in a detection optical path. When the scanning mirror vibrates at a fast frequency in a simple harmonic fashion, a projected light spot will reciprocate around the detection slit at a corresponding high speed. Periodically shaded by the slit, a photodetector will eventually detect a signal of a dynamic nature. The dynamic signal can be analyzed to derive a position for the light spot where a high signal-to-noise ratio (SNR) can be obtained. Based on this position, a level of the wafer surface can be determined and service as a basis for a wafer support mechanism to tune the wafer surface until it is located at an optimal focal plane. Reference can be made to Chinese Patent Application Publication No. CN100535763C for more details in this regard.

An existing scanning mirror-based photoelectric vertical measurement system typically consists of a projection branch with a projection slit and a detection branch with a detection slit. The projection and detection slit are of equal size, and a vertical level of an object being measured can be derived from a characteristic of a signal modulated by the scanning mirror.

As a signal modulator in the photoelectric vertical measurement system, the scanning mirror is considered as a critical component for the whole photoelectric vertical measurement system. However, as its performance can only be assessed in combination with the performance of other system components, whether it is functionally satisfactory will be known as late as in the system testing phase, and if is problematic, waste of labor, resources and time will be incurred. Up to now, there has not been any established measuring device capable of independently and accurately assessing the performance of a scanning mirror.

SUMMARY OF THE INVENTION

It is an objective of the present invention to provide a device and method for measuring amplitude of a scanning mirror, which can easily characterize the scanning mirror and determine whether it can perform in a desired way before it is put into use.

To this end, the present invention provides a device for measuring amplitude of a scanning mirror, including:

a light source for outputting an optical signal;

a diaphragm for modifying a size and a shape of a light spot of the optical signal output by the light source;

a scanning mirror retainer for placing a scanning mirror to be measured, the scanning mirror, after being retained, being able to periodically reflect the optical signal;

a photoelectric sensor disposed lateral to the scanning mirror, the photoelectric sensor including three or more sensing elements and configured to detect and collect the optical signal reflected by the scanning mirror; and a signal acquisition and processing unit for processing a signal collected by the photoelectric sensor to derive an amplitude of the scanning mirror.

Optionally, the optical signal output by the light source may be an optical signal with a spatial Gaussian distribution.

Optionally, a number of the sensing elements may be odd.

Optionally, the sensing elements may be densely disposed.

Optionally, the light spot may be round and have a diameter of equal to an effective area of the sensing element.

Optionally, the device may further include a position adjusting unit for adjusting a horizontal position of the photoelectric sensor, allowing the photoelectric sensor to locate at a first horizontal position or a second horizontal position.

Optionally, a distance from the first horizontal position to the second horizontal position ranges from 0.2 m to 1 m.

Optionally, the distance from the first horizontal position to the second horizontal position is 0.5 m.

The present invention also provides a method for measuring amplitude of a scanning mirror using the device for measuring amplitude of a scanning mirror as defined above, including:

recording vertical positions of the sensing elements $y_1, y_2, \ldots y_N$;

placing the scanning mirror on a scanning mirror retainer, causing the scanning mirror to vibrate at a frequency of so as to project a light spot onto a photoelectric sensor;

collecting, by a signal acquisition and processing unit, light intensities $I_{ji}$ detected by the sensing elements at time instants $t_{ji}$:

sensing element 1: $(t_{11}, I_{11})$, $(t_{12}, I_{12})$, . . . , $(t_{1i}, I_{1i})$ . . . , sensing element 2: $(t_{21}, I_{21})$, $(t_{22}, I_{22})$, . . . , $(t_{2i}, I_{2i})$ . . . ,

. . .

sensing element j: $(t_{j1}, I_{j1})$, $(t_{j2}, I_{j2})$, . . . , $(t_{ji}, I_{ji})$ . . . ,

. . .

sensing element N: $(t_{N1}, I_{N1})$, $(t_{N2}, I_{N2})$, . . . , $(t_{Ni}, I_{Ni})$;

fitting the collected light intensities $I_{j1}$ to determine, for each of the sensing elements, time instants $T_{jk}$ when maximum light intensities are recorded:

sensing element 1: $T_{11}, T_{12}, \ldots, T_{1k}, \ldots$, where $T_{11} < T_{12} < \ldots < T_{1k} < \ldots$, sensing element 2: $T_{21}, T_{22}, \ldots, T_{2k}, \ldots$, where $T_{21} < T_{22} < \ldots < T_{2k} < \ldots$,

. . .

sensing element j: $T_{j1}, T_{j2}, \ldots, T_{jk}, \ldots$, where $T_{j1} < T_{j2} < \ldots < T_{jk} < \ldots$,

. . .

sensing element N: $T_{N1}, T_{N2}, \ldots T_{Nk}, \ldots$, where $T_{N1} < T_{N2} < \ldots < T_{Nk} < \ldots$;

calculating, for each of the sensing elements, two successive time instant differences $T_{j(k+1)} - T_{jk}$ and $T_{jk} - T_{j(k-1)}$; identifying the $T_{j(k+1)} - T_{jk}$ for the sensing element having the two successive time instant differences both being greater than $1/(2f)$, and obtaining a vibration frequency fc of the light spot as $1/(T_{j(k+1)} - T_{jk})$; and for the sensing elements with the two successive time instant differences not both being greater than $1/(2f)$, obtaining the amplitude of the scanning mirror based on the vibration frequency fc of the light spot and vertical positions and time instants corresponding to maximum light intensities of said sensing elements with the two successive time instant differences not both being greater than 1/(2f), according to a vibration function, wherein N, i, j and k are positive integers, N≥3, and 1≤j≤N.

Optionally, the method may further include: arranging the photoelectric sensor at a first horizontal position to conduct measuring so as to obtain, by fitting, a first amplitude A1 of the scanning mirror at the first horizontal position; arranging the photoelectric sensor at a second horizontal position to conduct measuring so as to obtain, by fitting, a second amplitude A2 of the scanning mirror at the second horizontal position, where a distance from the second horizontal position to the first horizontal position is ΔL; and obtaining a maximum swing angle $\theta_m$ of a light beam reflected by the scanning mirror based on the first amplitude A1, the second amplitude A2 and the distance ΔL.

The device and method of the present invention entail a brand new solution in the art, which can easily characterize a scanning mirror and determine whether it can perform in a desired way before it is put into use.

DETAILED DESCRIPTION

The present invention will be described below in greater detail with reference to the accompanying schematics, which present preferred embodiments of the invention. It is to be appreciated that those skilled in the art can make changes to the invention disclosed herein while still obtaining the beneficial results thereof. Therefore, the following description shall be construed as being intended to be widely known by those skilled in the art rather than as limiting the invention.

For simplicity and clarity of illustration, not all features of the disclosed specific embodiment are described. Additionally, description and details of well-known functions and structures are omitted to avoid unnecessarily obscuring the invention. The development of any specific embodiment of the present invention includes specific decisions made to achieve the developer's specific goals, such as compliance with system-related and business-related constraints, which will vary from one implementation to another. Moreover, such a development effort might be complex and time consuming but would nevertheless be a routine undertaking for those of ordinary skill in the art.

The present invention will be further described in the following paragraphs by way of examples with reference to the accompanying drawings. Features and advantages of the invention will be more apparent from the following detailed description, and from the appended claims. Note that the accompanying drawings are provided in a very simplified form not necessarily presented to scale, with the only intention of facilitating convenience and clarity in explaining the embodiments.

Preferred embodiments of the present invention will be enumerated below in order for the invention to be better understood. It is to be noted that the invention is not limited to the embodiments disclosed below but intended to embrace all modifications made by those of ordinary skill in the art based on common general knowledge within its spirit and scope.

Figure 1:
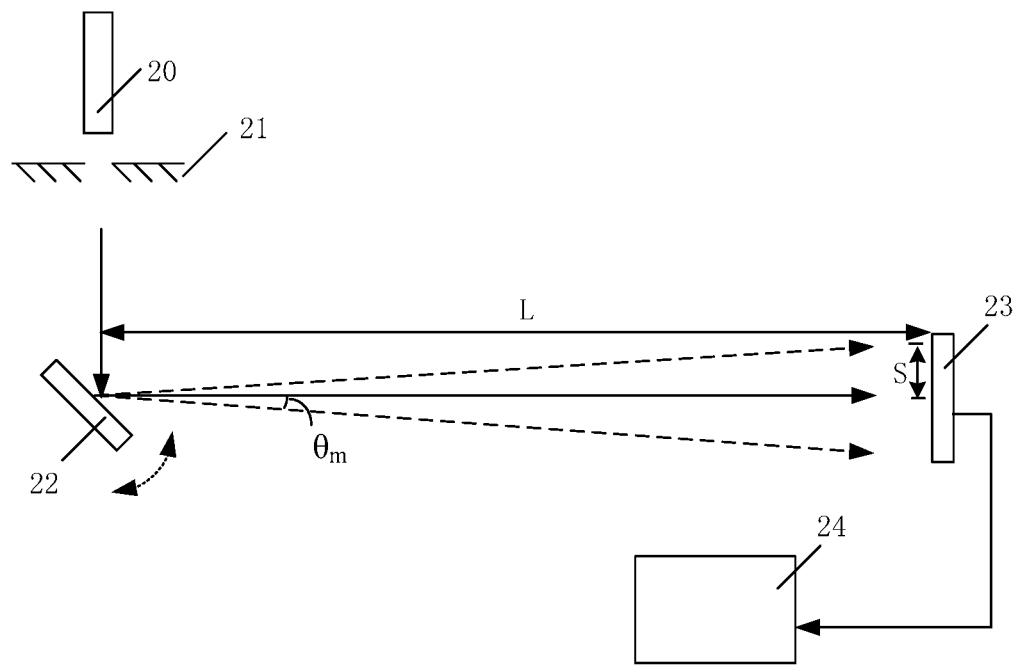
FIG. 1 is a structural schematic of a device for measuring amplitude of a scanning mirror according to an embodiment of the present invention.

Reference is now made to FIG. 1, which is a structural schematic of a device for measuring amplitude of a scanning mirror according to an embodiment of the present invention. As shown in FIG. 1, the device for measuring amplitude of a scanning mirror includes:

a light source 20, for outputting an optical signal;

a diaphragm 21 for modifying the size and shape of a light spot resulting from the optical signal output by the light source 20;

a scanning mirror retainer for holding the scanning mirror 22 to be measured while allowing the scanning mirror 22, after being held, to periodically vibrate and to periodically reflect the optical signal;

a photoelectric sensor 23 including three or more sensing elements and configured to detect and collect the optical signal reflected from the scanning mirror 22, the photoelectric sensor 23 optional disposed either at a first position 231 or a second position 232 (see FIG. 2); and a signal acquisition and processing unit 24 for deriving the amplitude of the scanning mirror by processing readings of the photoelectric sensor 23.

As also shown in FIG. 1, an optical path in this device of the present invention leads from the light source which emits a light beam. After the light beam passes through the diaphragm, a round light spot is formed on the scanning mirror 22 and reflected thereby onto the photoelectric sensor 23.

Specifically, in this embodiment, the optical signal output from the light source 20 is light with a spatial Gaussian distribution. The diaphragm 21 can ensure that the light spot on the photoelectric sensor 23 is sized equal to an effective area of each of the sensing elements in the photoelectric sensor 23 so as to be matched with the photoelectric sensor 23 to permit high measurement accuracy.

As can be seen from FIG. 1, when the scanning mirror 22 is vibrating periodically, the light beam is reflected periodically in a fan-out pattern at a maximum angle of $\theta_m$. That is, the light beam swings in cycles each consisting of swinging counterclockwise from an initial orientation by $\theta_m$, clockwise back to the initial orientation, clockwise from the initial orientation by $\theta_m$, and counterclockwise back to the initial orientation. In order for more accurate detection and sampling of the optical signal reflected from the scanning mirror 22 to be achieved, the number of the sensing elements may be odd, for example, 3, 5, 7, 9, 15 or the like. Whenever the scanning mirror 22 is oriented in correspondence with the initial orientation, the reflected optical signal is collected by the center one of the odd sensing elements. Otherwise, it will be collected by one of the remaining sensing elements. Further, in order to prevent loss of the optical signal, the sensing elements may be arranged densely. This, coupled with the fact that the effective area of each of the sensing elements is size equal to the light spot, can ensure that more comprehensive, more accurate data can be obtained.

In order for the amplitude of the scanning mirror 22 to be measurable, the light from the light source 20 is required to be fully incident on the reflecting surface of the scanning mirror 22. Hereinafter, the direction of an optical axis of the reflected light beam when it is at the initial orientation is defined as a horizontal direction, and a direction perpendicular to the horizontal direction is defined as a vertical direction. In this embodiment, the light exits the light source 20 in the vertical direction, and the photoelectric sensor 23 is oriented also in the vertical direction.

In FIG. 1, L denotes a horizontal distance between the scanning mirror 22 and the photoelectric sensor 23, and S represents a maximum vertical displacement of the light spot that can be effectuated by the scanning mirror 22.

Figure 2:
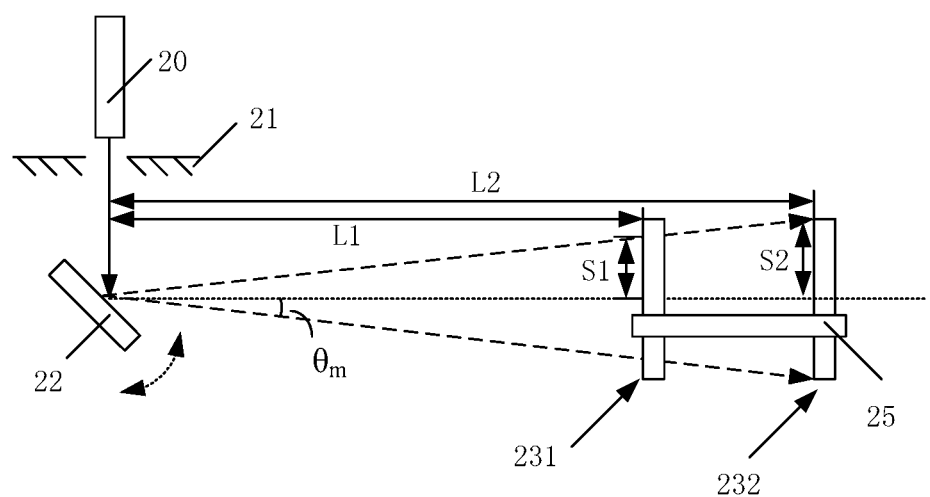
FIG. 2 schematically illustrates different positions where a photoelectric sensor in a device for measuring amplitude of a scanning mirror according to an embodiment of the present invention can be placed.

With additional reference to FIG. 2, the device for measuring amplitude of a scanning mirror may further include a position adjusting unit 25. The position adjusting unit 25 is configured to horizontally switch the photoelectric sensor 23 between a first position 231 and a second position 232. In this way, the photoelectric sensor 23 will receive different light intensities at the first and second positions 231, 232, which can facilitate the determination of the amplitude of the scanning mirror 22. The difference between a horizontal distance L1 from the scanning mirror 22 to the first position 231 and a horizontal distance L2 from the scanning mirror 22 to the second position 232 may range from 0.2 m to 1 m. That is, the distance between the first and second positions 231, 232 may be in the range of 0.2-1 m. More specifically, the distance may be, for example, 0.5 m. Accordingly, S1 denotes a maximum vertical displacement of the light spot that can be effectuated by the scanning mirror 22 at the first position 231, while S2 represents a maximum vertical displacement of the light spot that can be effectuated by the scanning mirror 22 at the second position 232.

Figure 3:
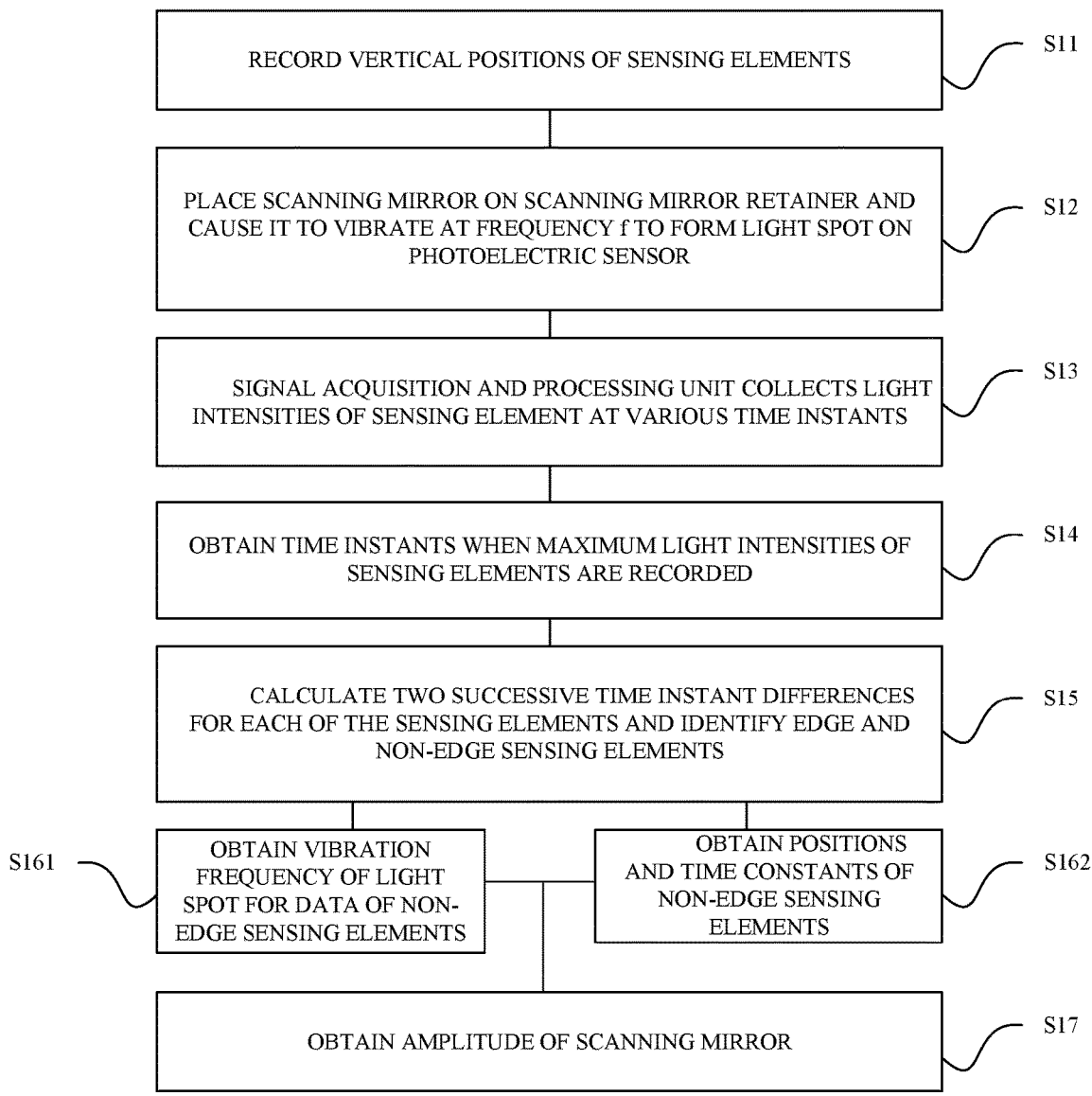
FIG. 3 is a flowchart of a method for measuring amplitude of a scanning mirror according to an embodiment of the present invention.

A method for measuring amplitude of a scanning mirror using the device as defined above will be described below with reference to FIG. 3. The method includes the steps as detailed below.

In step S11, vertical positions $y_1, y_2, \ldots, y_N$ of the sensing elements are recorded. Specifically, vertical positions of their centers may be recorded relative to a single reference point. Of course, this is just for easier implementation, and those skilled in the art can also record vertical positions of some edge points of the sensing elements, if appropriate, to represent the vertical directions of the whole sensing elements.

In step S12, the scanning mirror 22 is placed on the scanning mirror retainer and caused to vibrate at a fixed frequency f to project the light beam onto the photoelectric sensor 23.

In step S13, the signal acquisition and processing unit 24 collects light intensities $I_{ji}$ detected by the sensing elements at various time instants $t_{ji}$:

Sensing element 1: $(t_{11}, I_{11}), (t_{12}, I_{12}) \ldots, (t_{1i}, I_{1i}) \ldots$, Sensing element 2: $(t_{21}, I_{21}), (t_{22}, I_{22}), \ldots, (t_{2i}, I_{2i}) \ldots$,

. . .

Sensing element j: $(t_{uj1}, I_{j1}), (t_{j2}, I_{j2}), \ldots, (t_{ji}, I_{ji}) \ldots$,

. . .

Sensing element N: $(t_{N1}, I_{N1}), (t_{N2}, I_{N2}), \ldots, (t_{Ni}, I_{Ni}) \ldots$, where j represents the j-th sensing element, i denotes the i-th time instant, and $1 \leq j \leq N$.

In step S14, the light intensities detected by the sensing elements at the various time instants $t_{ji}$ and collected by the signal acquisition and processing unit 24 are fitted to find, for each of the sensing elements, the time instants $T_{jk}$ when the maximum light intensities are recorded:

Sensing element 1: $T_{11}, T_{12}, \ldots, T_{1k}, \ldots$, where $T_{11} < T_{12} < \ldots < T_{1k} < \ldots$, Sensing element 2: $T_{21}, T_{22}, \ldots T_{2k}, \ldots$, where $T_{21} < T_{22} < \ldots < T_{2k} < \ldots$,

. . .

Sensing element j: $T_{j1}, T_{j2}, \ldots, T_{jk}, \ldots$, where $T_{j1} < T_{j2} < \ldots < T_{jk} < \ldots$,

. . .

Sensing element N: $T_{N1}, T_{N2}, \ldots T_{Nk}, \ldots$, where $T_{N1} < T_{N2} < \ldots < T_{Nk} < \ldots$.

In step S15, for each of the sensing elements, two successive time instant differences $T_{j(k+1)} - T_{jk}$ and $T_{jk} - T_{j(k-1)}$ are calculated and serve as basis for identifying edge sensing elements and non-edge sensing elements. Specifically, $T_{j(k+1)} - T_{jk}$ and $T_{jk} - T_{j(k-1)}$ for each edge sensing element are both greater than $1/(2f)$, and $T_{j(k+1)} - T_{jk}$ and $T_{jk} - T_{j(k-1)}$ for each non-edge sensing element are not both greater than $1/(2f)$. The edge sensing elements are involved in calculating a vibration frequency fc of the light spot but not in calculating the amplitude A of the scanning mirror. The non-edge sensing elements are involved in calculating the amplitude A of the scanning mirror but not in calculating the vibration frequency fc.

Figure 4:
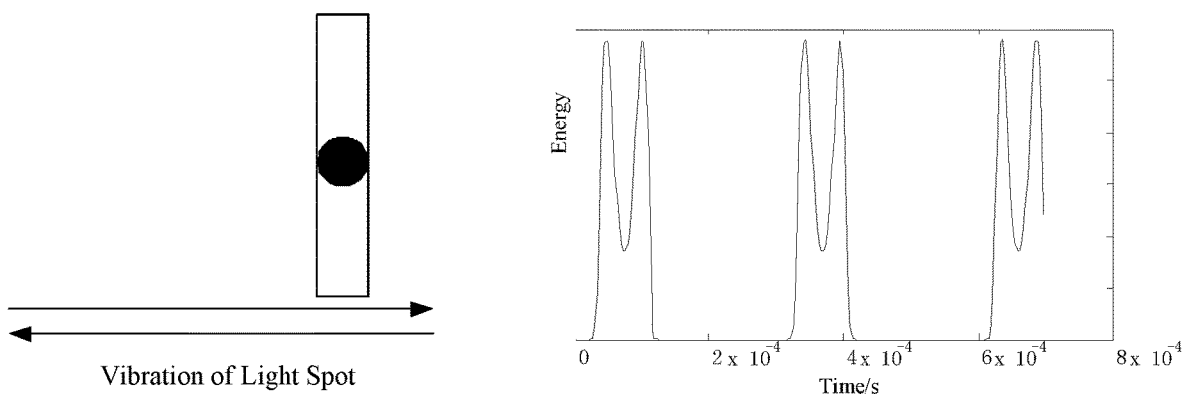
FIG. 4 shows a profile of energy received by an edge sensing element according to an embodiment of the present invention.
Figure 5:
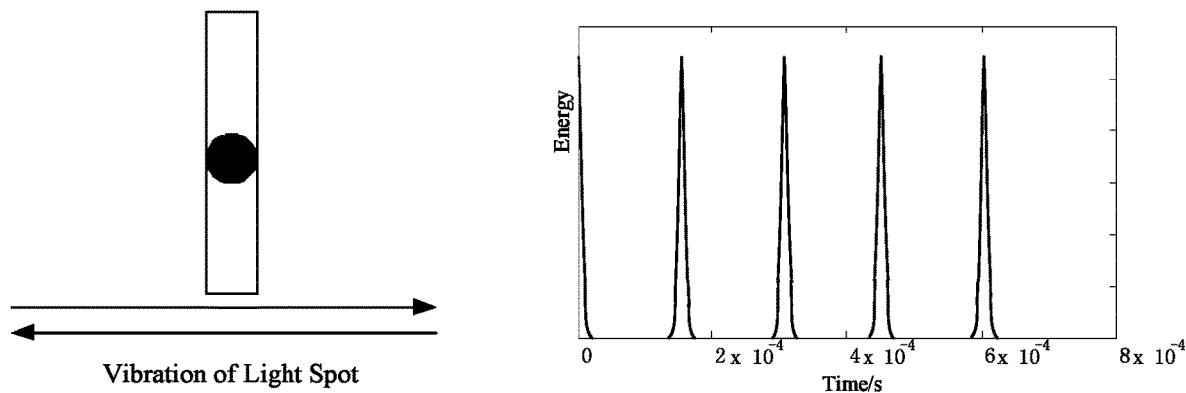
FIG. 5 shows a profile of energy received by a non-edge sensing element according to an embodiment of the present invention.

Here, the edge sensing elements refer to the two outermost sensing elements in the photoelectric sensor 23, while the non-edge sensing elements refer to all the other sensing elements than the two outermost sensing elements in the photoelectric sensor 23. Theoretically, as the edge sensing elements are disposed at opposing edges of the photoelectric sensor 23, the light intensities they receive peak once in each scanning cycle. Therefore, the time instant difference between two successively maximum light intensities is substantially equal to 1/f, and two successive such time instant differences are both greater than 1/2f. Each of the non-edge sensing elements experiences two light intensity peaks in each scanning cycle, so their two successive such time instant differences are not both greater than 1/2f. Here, reference can be made to FIGS. 4 and 5. FIG. 4 shows a profile of energy received by one of the edge sensing elements. Time instant differences between successive maximum light intensities determined by fitting the detection results of this edge sensing element are all greater than 1/2f. FIG. 5 shows a profile of energy received by one of the non-edge sensing elements at centers of the photoelectric sensor 23. Any two successive time instant differences between maximum light intensities of this non-edge sensing element are both equal to 1/2f (i.e., not both greater than 1/2f). Therefore, the profiles are much different and can be used to verify the calculation result. From the above analysis, it is apparent that edge sensing elements are those with almost constant time instant differences between successive maximum light intensities, and their time instant differences are obviously greater than those of the other sensing elements. Moreover, in addition to the above approach using two successive time instant differences, the edge sensing elements may also be identified using the energy profiles.

In step S161, based on the calculation performed in step S15, the vibration frequency fc of the light spot is obtained as the reciprocal of $(T_{j(k+1)} - T_{jk})$ of the edge sensing elements, i.e., $1/T_{j(k+1)} - T_{jk}$.

In step S162, based on the calculation performed in step S15, vertical positions $y_m$ and time instants $T_{mk}$ corresponding to maximum light intensities are obtained for each of the non-edge sensing elements:

Non-edge sensing element m $(_{m1}, y_m), (T_{m2}, y_m), (T_{mk}, y_m)$, where $1 \leq m < N-1$.

Figure 6:
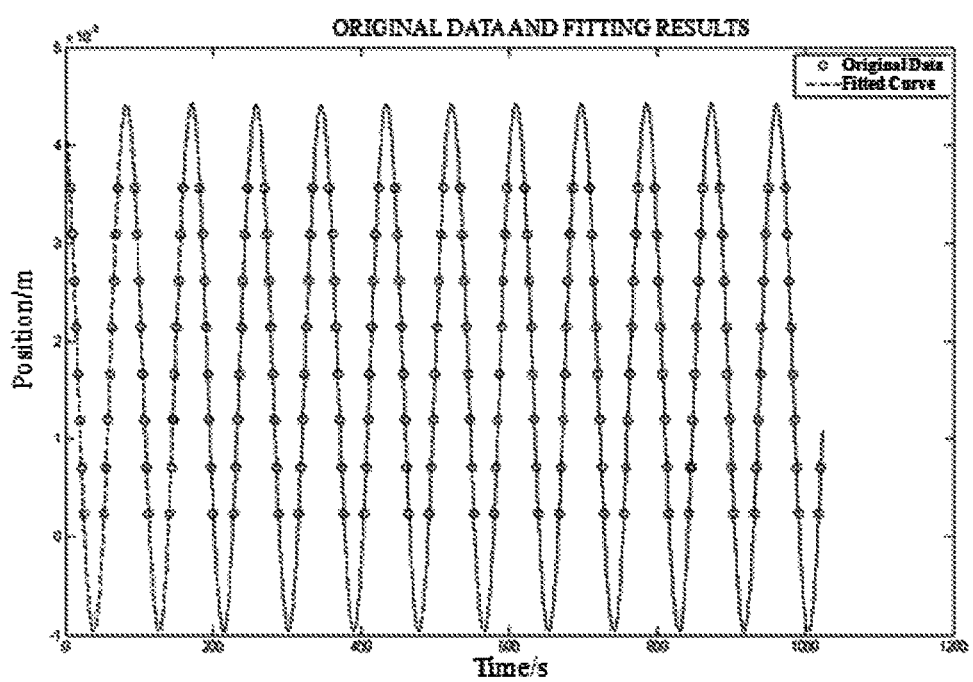
FIG. 6 shows a graphic representation of a vibration function according to an embodiment of the present invention.

In step S17, the amplitude A of the scanning mirror is calculated based on the vibration frequency fc of the light spot and the vertical positions $y_m$ and time instants $T_{mk}$ corresponding to maximum light intensities of the non-edge sensing elements according to the vibration function $y_m = A*\sin(2\pi f_c t_m + \varphi)$, where $y_m$ represents the positions of the light spot; $t_m$, the time instants; and $\varphi$, an initial phase. FIG. 6 shows a trajectory of the light spot on the photoelectric sensor as fitted using the vibration function.

In the above steps, it is to be understood that N, i, j, k, and m are all positive integers, and N≥3.

If desirable, the maximum swing angle $\theta_m$ of the light beam reflected by the scanning mirror 22 may also be determined.

Specifically, the photoelectric sensor 23 may be disposed at the first position 231, and amplitude A1 of the scanning mirror 22 at the first position may be obtained by performing the above steps S11-S17. The photoelectric sensor 23 may then be displaced horizontally by ΔL so that it is located at the second position 232, and amplitude A2 of the scanning mirror 22 at the second position may be obtained in a similar way.

The amplitudes A1, A2 and ΔL may be substituted into $A \approx 2\theta_m L$ to result in the following equations, where L represents the horizontal distance from the photoelectric sensor 23 to the scanning mirror, and A represents the amplitudes of the scanning mirror 22 at the above positions:

$$\begin{cases} A1 = 2\theta_m L1 \\ A2 = 2\theta_m L2 = 2\theta_m(L1 + \Delta L) \end{cases},$$

These equations may be solved to obtain the maximum swing angle $\theta_m$ of the light beam reflected by the scanning mirror as well as the horizontal distance L1 between the photoelectric sensor and the scanning mirror when the photoelectric sensor 23 is at the first position 231 and the horizontal distance L2 between the photoelectric sensor and the scanning mirror when the photoelectric sensor 23 is at the second position 232.

The device and method of the present invention entail a brand new solution in the art, which can easily characterize a scanning mirror and determine whether it can perform in a desired way before it is put into use.

It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

The invention claimed is:

1. A device for measuring amplitude of a scanning mirror, comprising:
   a light source for outputting an optical signal;
   a diaphragm for modifying a size and a shape of a light spot of the optical signal output by the light source;
   a scanning mirror retainer for placing a scanning mirror to be measured, the scanning mirror, after being retained, being able to periodically reflect the optical signal;
   a photoelectric sensor disposed lateral to the scanning mirror, the photoelectric sensor comprising three or more sensing elements and configured to detect and collect the optical signal reflected by the scanning mirror, wherein in a scanning cycle, when the scanning mirror is oriented in correspondence with an initial orientation, the reflected optical signal is collected by a center one of the three or more sensing elements, otherwise the reflected optical signal is collected by other ones of the three or more sensing elements; and
   a signal acquisition and processing unit for processing a signal collected by the photoelectric sensor to derive an amplitude of the scanning mirror.

2. The device for measuring amplitude of a scanning mirror of claim 1, wherein the optical signal output by the light source is an optical signal with a spatial Gaussian distribution.

3. The device for measuring amplitude of a scanning mirror of claim 1, wherein a number of the sensing elements is odd.

4. The device for measuring amplitude of a scanning mirror of claim 1, wherein the sensing elements are densely arranged.

5. The device for measuring amplitude of a scanning mirror of claim 1, wherein the light spot is round and has a diameter of equal to an effective area of the sensing element.

6. The device for measuring amplitude of a scanning mirror of claim 1, further comprising a position adjusting unit for adjusting a horizontal position of the photoelectric sensor, allowing the photoelectric sensor to locate at a first horizontal position or a second horizontal position.

7. The device for measuring amplitude of a scanning mirror of claim 6, wherein a distance from the first horizontal position to the second horizontal position ranges from 0.2 m to 1 m.

8. The device for measuring amplitude of a scanning mirror of claim 7, wherein the distance from the first horizontal position to the second horizontal position is 0.5 m.

9. A method for measuring amplitude of a scanning mirror using the device for measuring amplitude of a scanning mirror of claim 1, comprising:
   recording vertical positions of sensing elements $y_1, y_2, \ldots y_N$;
   placing the scanning mirror on a scanning mirror retainer, causing the scanning mirror to vibrate at a frequency of so as to project a light spot onto a photoelectric sensor;
   collecting, by a signal acquisition and processing unit, light intensities $I_{ji}$ detected by the sensing elements at time instants $t_{ji}$:
   sensing element 1: $(t_{11}, I_{11}), (t_{12}, I_{12}), \ldots, (t_{1i}, I_{1i}) \ldots,$
   sensing element 2: $(t_{21}, I_{21}), (t_{22}, I_{22}), \ldots (t_{2i}, I_{2i}) \ldots,$
   . . .
   sensing element j: $(t_{j1}, I_{j1}), (t_{j2}, I_{j2}), \ldots, (t_{ji}, I_{ji}) \ldots,$
   . . .
   sensing element N: $(t_{N1}, I_{N1}), (t_{N2}, I_{N2}), \ldots, (t_{Ni}, I_{Ni})$;
   fitting the collected light intensities $I_{ji}$ to determine, for each of the sensing elements, time instants $T_{jk}$ when maximum light intensities are recorded:
   sensing element 1: $T_{11}, T_{12}, \ldots, T_{1k}, \ldots,$ where $T_{11} < T_{12} < \ldots < T_{1k} < \ldots,$ sensing element 2: $T_{21}, T_{22}, \ldots, T_{2k}, \ldots$, where $T_{21} < T_{22} < \ldots < T_{2k} < \ldots$,

. . .

sensing element j: $T_{j1}, T_{j2}, \ldots, T_{jk}, \ldots$, where $T_{j1} < T_{j2} < \ldots < T_{jk} < \ldots$,

. . .

sensing element N: $T_{N1}, T_{N2}, \ldots, T_{Nk}, \ldots$, where $T_{N1} < T_{N2} < \ldots < T_{Nk} < \ldots$;

calculating, for each of the sensing elements, two successive time instant differences $T_{j(k+1)} - T_{jk}$ and $T_{jk} - T_{j(k-1)}$; identifying the $T_{j(k+1)} - T_{jk}$ for the sensing element having the two successive time instant differences both being greater than $1/(2f)$, and obtaining a vibration frequency fc of the light spot as $1/(T_{j(k+1)} - T_{jk})$; and for the sensing elements with the two successive time instant differences not both being greater than $1/(2f)$, obtaining the amplitude of the scanning mirror based on the vibration frequency fc of the light spot and vertical positions and time instants corresponding to maximum light intensities of said sensing elements with the two successive time instant differences not both being greater than $1/(2f)$, according to a vibration function, wherein N, i, j and k are positive integers, $N \geq 3$, and $1 \leq j \leq N$.

10. The method for measuring amplitude of a scanning mirror of claim 9, further comprising: arranging the photoelectric sensor at a first horizontal position to conduct measuring so as to obtain, by fitting, a first amplitude A1 of the scanning mirror at the first horizontal position; arranging the photoelectric sensor at a second horizontal position to conduct measuring so as to obtain, by fitting, a second amplitude A2 of the scanning mirror at the second horizontal position, where a distance from the second horizontal position to the first horizontal position is ΔL; and obtaining a maximum swing angle $\theta_m$ of a light beam reflected by the scanning mirror based on the first amplitude A1, the second amplitude A2 and the distance ΔL.

* * * * *